ENCLOSURE FOR ELECTRICAL CIRCUIT DEVICES

Filed March 14, 1963 2 Sheets-Sheet 1

INVENTORS
ROGER G. ARGUIN AND
ALFRED A. STIEFEL
BY Henry Huff
ATTORNEY

ENCLOSURE FOR ELECTRICAL CIRCUIT DEVICES

Filed March 14, 1963 2 Sheets-Sheet 2

INVENTORS
ROGER G. ARGUIN AND
ALFRED A. STIEFEL
BY Harry Hoff
ATTORNEY 3,258,649

ENCLOSURE FOR ELECTRICAL CIRCUIT DEVICES

Roger G. Arguin, Huntington Station, and Alfred A. Stiefel, Bronx, N.Y., assignors to Cutler-Hammer, Inc., Milwaukee, Wis., a corporation of Delaware Filed Mar. 14, 1963, Ser. No. 265,215
8 Claims. (Cl. 317—101)

This invention relates to improvements in structural assemblies of electrical devices such as low frequency and intermediate frequency amplifiers, and particularly to devices of the type utilizing flat circuit boards which support the various circuit elements, e.g. resistors and capacitors, and the interconnections between said elements.

Circuit boards are used extensively in various kinds of radio equipment, electronic computers and other devices in which a complete subcombination such as an amplifier or a logic element may be assembled on a single board and constitute an independent unit or module to be inserted as a replaceable package in a more complex system. Often the circuit board is in the form of a so-called "printed circuit" wherein the interconnections between the circuit elements, and possibly some of the circuit elements themselves, are formed of thin metallic films deposited on boards or sheets of insulating material.

The principal object of the present invention is to provide an improved type of structural assembly wherein a circuit board is securely supported so as to withstand severe vibration conditions and is surrounded by a substantially watertight enclosure which also serves as an electrical shield.

Another object is to provide assemblies of the foregoing type that are simple and inexpensive, requiring relatively few parts and a minimum number of fastener elements.

A further object is to provide an improved type of shielding and circuit board supporting structure adapted to fabrication from extruded stock material of standardized cross sectional shapes.

Another object is to provide enclosures of the above type that are adapted for stacking in blocks or columns, whereby a group of associated devices may be arranged compactly as modules of a complex system.

Still another object is to provide assemblies of the foregoing type that are readily disassembled for service or repair, easy to assemble or reassemble, yet substantially shockproof and reliable when assembled.

In a presently preferred embodiment of the invention, the enclosure includes a pair of metallic angle members of generally L-shaped cross section, interfitting to form a rectangular tube provided with grooves in its interior walls engaged by the lateral edge regions of the circuit board, and resilient means urging edge regions of the board into firm contact with associated groove walls.

The invention will be described with reference to the accompanying drawings, wherein.

Figure 1:
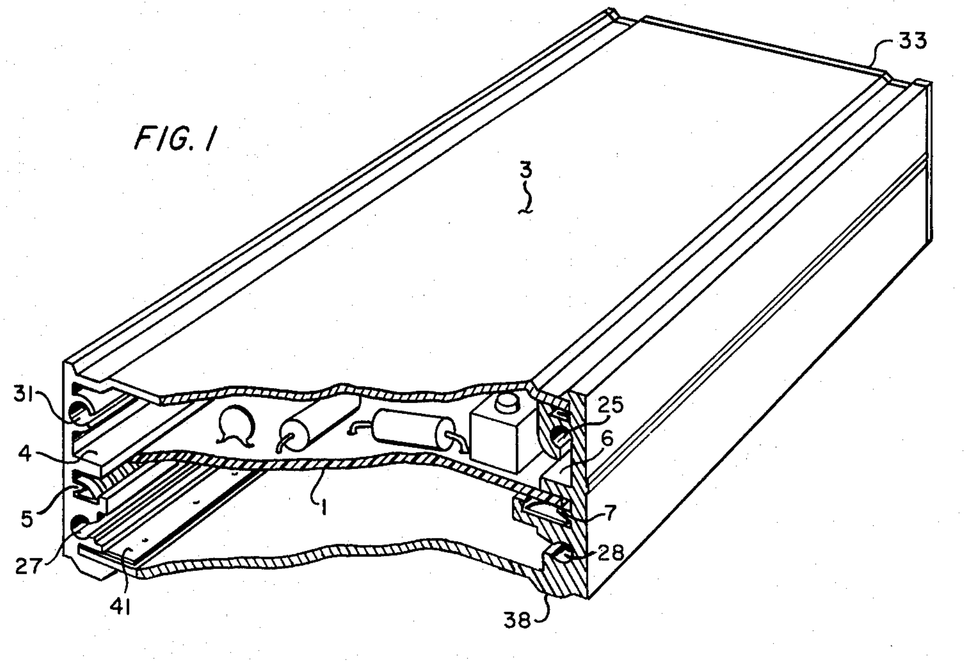
FIG. 1 is a perspective view of a presently preferred embodiment of the invention, partially broken away to show internal details.
Figure 2:
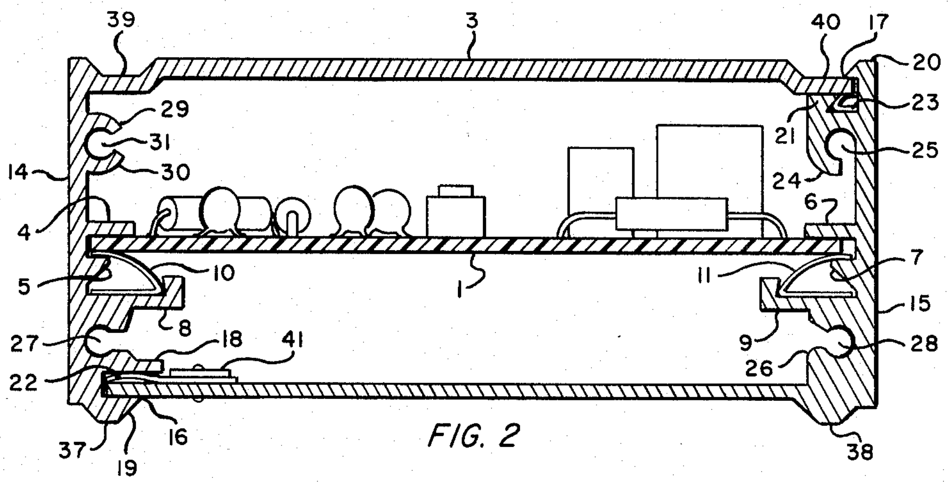
FIG. 2 is a transverse cross sectional view of the structure of FIG. 1.

Referring to FIGS. 1 and 2, the electrical components of a circuit, for example an amplifier, are secured to and supported by a board 1 of insulating material. The components may be interconnected by wiring or by a "printed" circuit comprising thin film conductors deposited on one or both surfaces of the board 1. Preferably both major surfaces of the board are provided with conductive ground strips extending along the lateral edge regions of the board throughout its length. The board 1 is of uniform width, preferably of a standardized dimension so that a stock width may be used for any of a variety of devices, being merely cut to the length required to accommodate the components of the particular device to be assembled.

The board 1 is surrounded by a generally rectangular tubular enclosure 3, and is supported therein by longitudinal ribs 4, 5, 6 and 7 on the internal surfaces of the side walls of the enclosure 3. As shown more clearly in FIG. 2, the pairs of ribs 4, 5 and 6, 7 define longitudinal slots that receive the respective lateral edge portions of the board 1. Below the ribs 5 and 7 are further ribs 8 and 9, shaped as shown to cooperate with the lower surfaces of ribs 5 and 7 to define longitudinal recesses for supporting and laterally confining spring finger strips 10 and 11.

Figure 3:
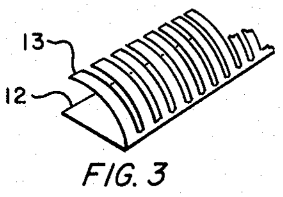
FIG. 3 is a perspective view of a spring finger strip used in the assembly of FIG. 2.

Referring to FIG. 3, the spring finger strips each consist of a single strip 12 of thin spring material such as beryllium bronze, serrated along one side to provide a series of fingers 13, and bent about a longitudinal axis to a generally V shaped cross section adapted to fit in the recesses above the ribs 8 and 9 as shown in FIG. 2. In the assembled device, the finger portions 13 of strips 10 and 11 enter the grooves between the ribs 4, 5 and 6, 7 in close contact with the lateral edge regions of the lower surface of the board 1, resiliently forcing the corresponding regions of the upper surface firmly against the lower sides of the upper ribs 4 and 6.

In the embodiment of the invention illustrated in FIGS. 1 and 2, the housing 3 consists of two angle members 14 and 15 of generally L shaped cross sections, interfitting at their extremities 16 and 17 to form the rectangular tube. To this end, the lower extremity of the member 14 is provided with ribs 18 and 19 defining a longitudinal groove receiving the left hand edge of the member 15, and the upper extremity of the member 15 is provided with ribs 20 and 21 defining a groove that receives the right hand edge of the member 14, as shown. A spring finger strip 22, generally similar to the strip shown in FIG. 3 but not folded, is secured to the upper (internal) surface of the left hand edge region of the member 15, cooperating with the lower surface of ribs 18 to force said edge region into contact with the upper surface of the rib 19.

The upper side of the rib 21 on the member 15 contains a longitudinal recess for supporting and laterally restraining a spring finger strip 23 which is similar to the strip 11, but smaller. The strip 23 urges the right hand edge region of the member 14 into contact with the lower surface of the rib 20.

The lower side of the rib 21 includes a downward extension 24 curved internally to define, with the adjacent wall portion of the member 15, a longitudinal slot 25 having an internal cross section that is substantially arcuate and subtends an angle appreciably greater than 180 degrees. The lower sides of ribs 8 and 9 are shaped to define, with ribs 18 and 26, respective similar arcuate slots 27 and 28. A pair of ribs 29 and 30 near the internal corner of angle member 14 define a further arcuate slot 31. The slots 25, 27, 28 and 31 are adapted to receive and be engaged by longitudinally directed fastening means, such as self-tapping screws, for securing cover plates 33 and 35 at the ends of the tubular enclosure, as shown in FIGS. 1 and 3.

The lower part 37 of the rib 19 at the lower edge of member 14 is shaped as shown to act as a longitudinally extending supporting foot. A similar foot 38 is located near the lower right hand side of the member 15. The upper outside surfaces of the member 14 and the rib 20 are shaped to define grooves 39 and 40 that are conformal to, and lie directly above, the feet 37 and 38.

In the manufacture of a device of the above-described type, for example an amplifier, the particular components to be used, and their interconnections, are determined principally by the required performance characteristics. The mechanical layout of the circuit is planned so as to fit on a circuit board of standard width, the length of the board being determined by the area required to accommodate the complete circuit. Many types of electronic devices, such as amplifiers, consist of a series of stages that can be designed to have substantially identical circuit patterns. In such cases, a standard stage layout may be used, repeated end-to-end according to the number of stages required.

The L shaped angle members 14 and 15 are each of uniform cross section, and may be fabricated conveniently by cutting the required lengths from stack material produced by conventional extrusion methods. The spring finger strips 10, 11, 22 and 23 may be formed as required from flat strip material, or cut to length from stocks of previously formed strips.

The strip 22 is secured near the lower edge of member 15 as by riveting under a relatively rigid pressure distributing strip 41. The strips 10, 11 and 23 may be inserted laterally into their respective grooves, where they fit loosely until stressed during subsequent steps of assembly. One edge of the board 1 is then inserted into the appropriate slot, for example the slot defined by the ribs 4 and 5 on the member 14. This forces the fingers on spring strip 10 downward slightly, holding the edge of the board against the rib 4 and locking the strip 10 in the retaining groove in the upper surface of the rib 8.

The other angle member, 15, is placed in alignment with the member 14 and forced laterally toward it, causing the edge of board 1 to enter the slot between ribs 6 and 7, and the edges of members 14 and 15 to enter the respective slots. This operation requires substantial force, and the parts must be initially held in such relative position that the slots and edges will all engage properly. A press equipped with a suitable jig or fixture may be used for this purpose.

When the angle members 14 and 15 have been assembled, the resulting tubular housing is electrically and mechanically substantially equivalent to a unitary piece, and cannot be separated by any ordinary vibration or acceleration forces. The circuit board is similarly firmly held in place, substantially immovable laterally or longitudinally by any force less than destructive. In the event that the housing must be removed for repair or alteration of the circuit, the parts 14 and 15 can be separated in a press equipped with a suitable fixture arranged to apply appropriate lateral outward force between the parts.

Figures 4, 5:
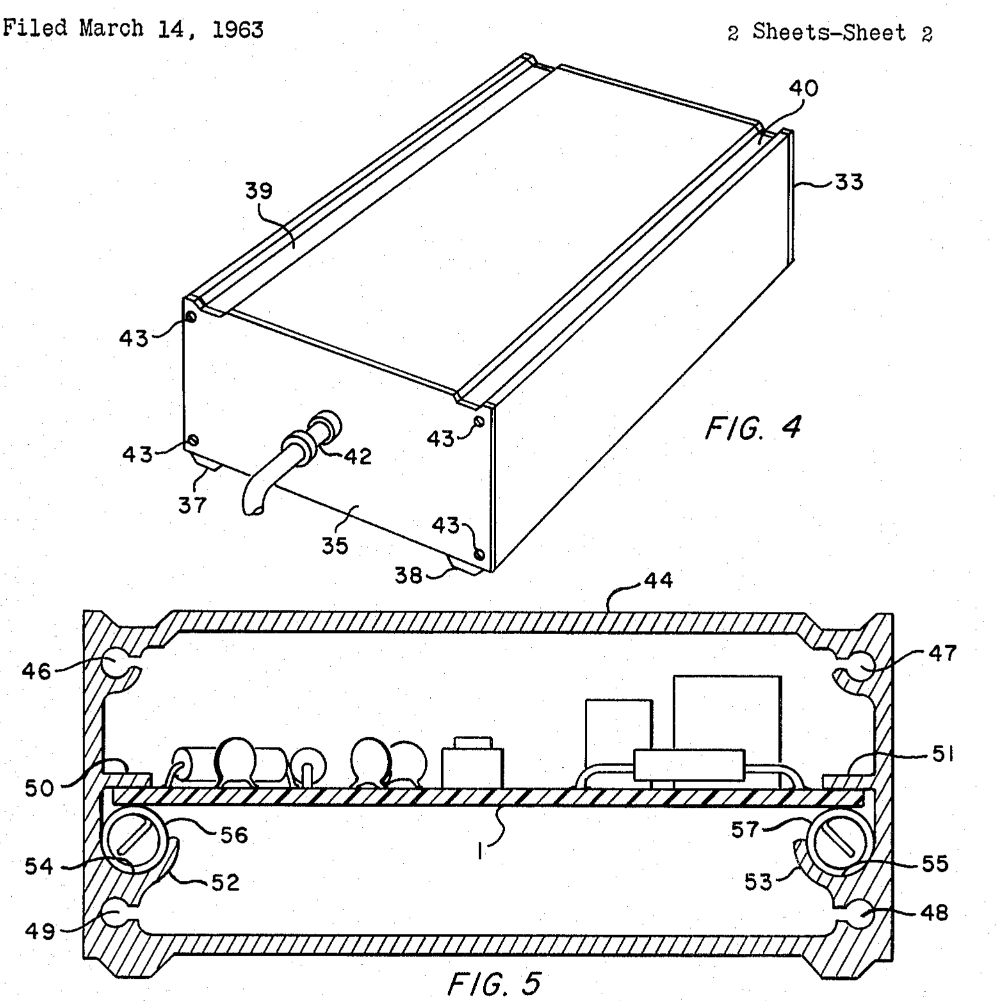
FIG. 4 is a perspective view of a complete assembly of the type shown in FIG. 1, showing the external appearance with end plates in place.
FIG. 5 is a transverse cross sectional view of a modification of the device of FIG. 1, wherein the tubular housing is formed of a single unitary member.

Input, output and power supply connections are made to the circuit board by way of cable connectors such as 42 (see FIG. 4) mounted in the end plates 33 and 35. The plates 33 and 35 are secured by conventional fasteners such as self-tapping screws 43 passing through holes in the end plates and engaging the interior walls of grooves 25, 27, 28 and 31. With the end plates in place, the completed device appears substantially as shown in FIG. 4. The bottom external ribs 37 and 38 serve conveniently as supporting feet if the device is to be placed or mounted upon a flat surface. Two or more devices such as that of FIG. 4 may be stacked, if desired, with the ribs 37 and 38 of the upper one engaging the external grooves 39 and 40 of the lower.

Referring to FIG. 5, the tubular housing member 44 in this case is a single piece of material which may be cut to the required length from a stock of tubing of the illustrated cross section. The internal wall is provided with means defining arcuate grooves 46, 47, 48 and 49 for cooperation with end plate fasteners like the grooves 25, 27, 28 and 31 of FIG. 2. Opposed ribs 50 and 51 are provided on the side walls for engagement with the upper lateral edge regions of the board 1. Further ribs 52 and 53 are disposed below and parallel to ribs 50 and 51, and are shaped to define arcuate grooves 54 and 55 opening upwardly as shown.

The grooves 54 and 55 are adapted to support, and restrain from lateral movement, a pair of helical springs 56 and 57. The springs 56 and 57 in a partially expanded condition apply a firm uniform pressure between the grooves 54 and 55 and the lower surface edge regions of the board 1, sufficient to effectively prevent lateral or longitudinal movement of the board within the housing.

In the assembly of the device of FIG. 5, the prepared circuit board, with the electrical components mounted and interconnected, is pushed longitudinally into the tubular housing member 44 before the springs 56 and 57 are inserted. When the board is in position, each spring is placed on a small mandrel and wound tightly thereon to reduce its outside diameter so that the spring and mandrel can readily be inserted lengthwise of the groove 54 or 55. The spring may be held under tension during insertion by any suitable means, for example a slot at one end of the mandrel and a clamp at the other. After the spring is in place, it is released and expands partially, to the extent permitted by the size of the groove and the location of the lower surface of the board 1. With the spring thus partly expanded, the mandrel is freely movable and may be withdrawn. The completed device, with the end plates in place, has substantially the same exterior appearance as that shown in FIG. 4. In some instances, the structure of FIG. 5 may be preferable to that of FIGS. 1 and 2 because it has fewer parts and is easier to assemble.

Figure 6:
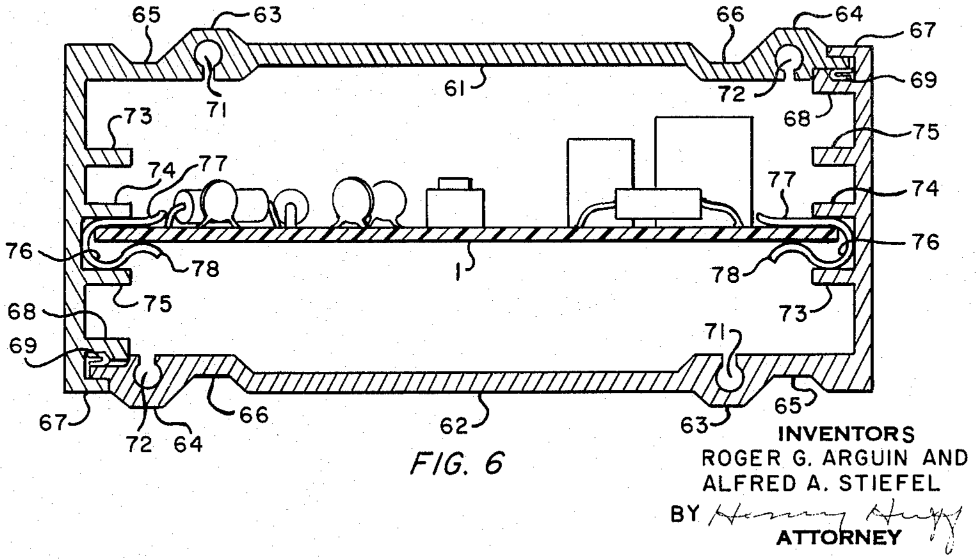
FIG. 6 is a transverse cross sectional view of another modification wherein the tubular housing consists of two angle members that have identical cross sections.

The modification shown in FIG. 6 is somewhat similar to that of FIG. 1, differing principally in that the two L shaped angle members 61 and 62 are of identical cross section. The exterior of each broad wall is provided with two longitudinal ribs 63 and 64 and two complementarily shaped grooves 65 and 66, disposed as shown so that two or more assembled housings may be stacked, with the ribs 63 and 64 on the upper surface of one housing engaging the grooves 66 and 65 respectively on the lower surface of the one on top of it.

The inside surfaces of members 61 and 62 are provided with ribs 67 and 68 defining slots for engagement with the edges of the broad walls of each other. Ribs 68 are shaped to retain spring finger strips 69, similar to the strip 23 of FIG. 2. Arcuate grooves 71 and 72 are formed inside ribs 63 and 64 for cooperation with end plate fasteners.

The interior narrow wall of each member 61 and 62 includes at least three longitudinal ribs 73, 74 and 75, disposed in such manner that two ribs in the member 61, for example ribs 74 and 75, lie directly opposite two ribs, 74 and 73 respectively, in the member 62 when said members are in the assembled relationship as shown.

The circuit board 1 is held at its edge regions between the respective ribs 74, 75 and 74, 73 by spring finger strips 76, which are generally similar to those shown in FIG. 3 but shaped as shown in FIG. 6, with a flat portion 77 at one side and a doubly curved portion 78 at the other. The curved part 78 is serrated as at 13 in FIG. 3.

In assembling the structure of FIG. 6, the spring finger strips 76 are pressed on the edge regions of the board 1, and one edge of the board, for example the left hand edge, is forced into the space between ribs 74 and 75. The members 61 and 62 are then placed in alignment and pressed together, as in the assembly of the device of FIGS. 1 and 2. The end plates are attached in the same manner as in the previously described devices. The embodiment of FIG. 6 may be preferable in circumstances where it is desirable to make the tubular housing in two separable parts while retaining the advantage of using a single type of extrusion.

We claim:

1. An electrical device assembly, comprising a circuit board supporting the electrical components of the device and the connections between said components, an electrical shielding enclosure of generally rectangular tubular cross section having top, bottom and side walls, the interior surfaces of the side walls of the enclosure being provided with spaced parallel ribs defining grooves receiving the lateral edge regions of said circuit board, resilient means urging said edge regions against respective sides of said grooves, in frictional engagement therewith under sufficient pressure to substantially prevent movement of said circuit board relative to said enclosure further means on the interior surfaces of said enclosure defining longitudinal grooves with an internal cross section substantially wider than the lateral openings thereof, generally rectangular end plate closures at the ends of said enclosure, and means removably securing said end plates including fasteners extending into and cooperating with the interior surfaces of said last mentioned grooves.

2. The structure claimed in claim 1, further including a pair of longitudinal ribs on the outer surface of the bottom wall of said enclosure, and a pair of conformally located grooves in the exterior surface of the top wall, to facilitate alignment in stacking a plurality of such structures.

3. The structure claimed in claim 1, wherein one of said ribs defining each of said first mentioned grooves also defines a further longitudinal groove facing a surface of said board adjacent a respective lateral edge region and supporting and confining said resilient means.

4. The structure claimed in claim 2, wherein said resilient means is a helical spring with its longitudinal axis extending longitudinally of said board.

5. The structure claimed in claim 2, wherein said resilient means is a spring finger strip substantially longitudinally coextensive with said board.

6. The structure claimed in claim 2, wherein all of said ribs and grooves are parallel to the longitudinal axis of said enclosure, and each is of uniform cross section throughout its length, whereby said enclosure is adapted to fabrication by extrusion.

7. An electrical device assembly, comprising a circuit board supporting the electrical components of the device and the connections between said components, two angle members of generally L shaped cross section interfitting to form the top, bottom and side walls of an electrical shielding enclosure of generally rectangular cross section, the interior surfaces of the side walls of the enclosure being provided with spaced parallel ribs defining grooves receiving the lateral edge regions of said circuit board, means resiliently urging said edge regions against respective sides of said grooves, in frictional engagement therewith under sufficient pressure to substantially prevent movement of said circuit board relative to said enclosure, further pairs of spaced parallel ribs on the interior surfaces of said enclosure defining longitudinal grooves with an internal cross section substantially wider than the lateral openings thereof, generally rectangular end plate closures at the ends of said enclosure, and means removably securing said end plates including fasteners extending into and cooperating with the interior surfaces of said last mentioned grooves, said end plates being provided with input and output connections for said device.

8. A support and electric shielding enclosure for electric circuit boards, comprising a pair of elongated conductive members of generally L shaped cross section, each of said members having a plurality of parallel longitudinally extending grooves on the interior surface of one of its sides, one of said grooves lying adjacent the outer edge of said side and opening in a direction parallel to the other of said sides for receiving the outer edge of the respective other side of the other member, said members together forming a hollow tubular structure of substantially rectangular cross section, another of said grooves lying between the inner and outer edges of said side, said latter grooves in said members lying in juxtaposition in the assembled tubular structure for engagement with the respective opposite lateral edges of a circuit board, means for engagement with the surface of said board along said edges resiliently urging said board against one side of each of said latter grooves, in frictional engagement therewith under sufficient pressure to substantially prevent movement of said circuit board relative to said enclosure and others of said longitudinally extending grooves in said members lying near the corners of the assembled tubular structure, said last mentioned grooves having an internal cross section that is substantially wider than the lateral openings thereof, for receiving threaded fasteners adapted to secure end closure plates to the assembled tubular structure.

References Cited by the Examiner

UNITED STATES PATENTS

| | | | |
|---|---|---|---|
| 2,731,609 | 1/1956 | Sobel | 339—17 |
| 2,893,137 | 7/1959 | Alling et al. | 317—101 |
| 2,894,077 | 7/1959 | McCoy. | |

ROBERT K. SCHAEFER, *Primary Examiner.*

JOHN F. BURNS, KATHLEEN H. CLAFFY, *Examiners.*

J. G. COBB, J. J. BOSCO, *Assistant Examiners.*